United States Patent
Ozaki et al.

(10) Patent No.: US 9,647,084 B2
(45) Date of Patent: May 9, 2017

(54) SEMICONDUCTOR DEVICE AND METHOD OF MANUFACTURING THE SAME

(71) Applicant: FUJITSU LIMITED, Kawasaki-shi, Kanagawa (JP)

(72) Inventors: Shirou Ozaki, Yamato (JP); Naoya Okamoto, Isehara (JP); Kozo Makiyama, Kawasaki (JP); Toshihiro Ohki, Hadano (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/966,866

(22) Filed: Dec. 11, 2015

(65) Prior Publication Data
US 2016/0099335 A1 Apr. 7, 2016

Related U.S. Application Data

(62) Division of application No. 14/219,375, filed on Mar. 19, 2014, now Pat. No. 9,257,514.

(30) Foreign Application Priority Data

Apr. 16, 2013 (JP) ................................. 2013-086099

(51) Int. Cl.
*H02M 5/45* (2006.01)
*H01L 29/66* (2006.01)
(Continued)

(52) U.S. Cl.
CPC ...... *H01L 29/66462* (2013.01); *H01L 21/283* (2013.01); *H01L 21/764* (2013.01);
(Continued)

(58) Field of Classification Search
CPC ......... H01L 2924/0002; H01L 2924/00; H01L 21/283; H01L 21/764; H01L 21/7682;
(Continued)

(56) References Cited

U.S. PATENT DOCUMENTS 7,012,274 B2 * 3/2006 Taylor ................... B82Y 20/00 257/12
9,024,324 B2 * 5/2015 Teplik ................... H01L 29/402 257/76

(Continued)

FOREIGN PATENT DOCUMENTS

JP H05-335343 12/1993
JP H11-126820 A 5/1999
(Continued)

OTHER PUBLICATIONS

Office Action of correspondingTaiwan Patent Application 103110689 dated Jun. 17, 2015, with partial translation.
(Continued)

*Primary Examiner* — Mohammed Shamsuzzaman
(74) *Attorney, Agent, or Firm* — Kratz, Quintos & Hanson, LLP

(57) ABSTRACT

A semiconductor device includes: a first electrode; a second electrode; an interlayer insulating film made of a porous insulating material and formed above the first electrode and the second electrode; and connection parts electrically connected to the first electrode and the second electrode respectively, wherein a cavity is formed between the interlayer insulating film and a surface of the first electrode, a surface of the second electrode, and parts of surfaces of the connection parts.

7 Claims, 14 Drawing Sheets

(51) Int. Cl.
 H01L 29/40 (2006.01)
 H01L 21/768 (2006.01)
 H01L 29/778 (2006.01)
 H01L 29/205 (2006.01)
 H01L 23/31 (2006.01)
 H01L 29/20 (2006.01)
 H01L 23/532 (2006.01)
 H01L 21/283 (2006.01)
 H01L 21/764 (2006.01)
 H02M 5/458 (2006.01)
 H03F 3/19 (2006.01)
 H01L 23/522 (2006.01)
 H01L 29/78 (2006.01)

(52) U.S. Cl.
 CPC .... *H01L 21/7682* (2013.01); *H01L 21/76825* (2013.01); *H01L 21/76826* (2013.01); *H01L 21/76879* (2013.01); *H01L 23/315* (2013.01); *H01L 23/53295* (2013.01); *H01L 29/2003* (2013.01); *H01L 29/205* (2013.01); *H01L 29/408* (2013.01); *H01L 29/7786* (2013.01); *H01L 29/7787* (2013.01); *H02M 5/458* (2013.01); *H03F 3/19* (2013.01); *H01L 23/5222* (2013.01); *H01L 29/78* (2013.01); *H01L 2924/0002* (2013.01)

(58) Field of Classification Search
 CPC ......... H01L 21/76825; H01L 21/76826; H01L 21/76879; H01L 23/315; H01L 23/5222; H01L 23/53295; H01L 29/2003
 USPC .......... 257/194, 288, 76, 215; 438/182, 619, 438/597; 363/37
 See application file for complete search history.

(56) References Cited

U.S. PATENT DOCUMENTS

| 2002/0047207 | A1 | 4/2002 | Sekiguchi | |
| 2003/0203592 | A1* | 10/2003 | Kloster | H01L 21/764 438/411 |
| 2004/0058485 | A1* | 3/2004 | Makiyama | H01L 21/28587 438/182 |
| 2004/0079971 | A1* | 4/2004 | Taylor | B82Y 20/00 257/215 |
| 2004/0102031 | A1 | 5/2004 | Kloster et al. | |
| 2004/0157423 | A1* | 8/2004 | Behammer | H01L 21/28587 438/597 |
| 2005/0121786 | A1 | 6/2005 | Furuya et al. | |
| 2007/0123026 | A1* | 5/2007 | Aihara | H01L 24/03 438/619 |
| 2008/0087916 | A1* | 4/2008 | Amasuga | H01L 29/7787 257/194 |
| 2008/0169542 | A1 | 7/2008 | Suzuki et al. | |
| 2009/0104571 | A1 | 4/2009 | Liu et al. | |
| 2009/0166815 | A1 | 7/2009 | Makiyama et al. | |
| 2009/0242938 | A1* | 10/2009 | Niiyama | H01L 29/0843 257/194 |
| 2012/0037962 | A1* | 2/2012 | Breyta | H01L 21/31144 257/288 |
| 2012/0199991 | A1* | 8/2012 | Okamoto | H01L 23/3142 257/790 |
| 2012/0205662 | A1 | 8/2012 | Nakamura et al. | |
| 2012/0273770 | A1* | 11/2012 | Sunagawa | C07D 487/04 257/40 |
| 2013/0134512 | A1* | 5/2013 | Cheng | H01L 29/402 257/339 |
| 2013/0161782 | A1* | 6/2013 | Rajendran | H01L 23/13 257/506 |
| 2013/0228788 | A1* | 9/2013 | Yamamura | H01L 29/2003 257/76 |
| 2013/0228789 | A1* | 9/2013 | Yamamura | H01L 29/2003 257/76 |
| 2013/0228790 | A1* | 9/2013 | Yamamura | H01L 29/2003 257/76 |
| 2013/0277680 | A1* | 10/2013 | Green | H01L 29/402 257/76 |
| 2014/0319584 | A1* | 10/2014 | Cai | H01L 29/42316 257/194 |
| 2015/0028345 | A1* | 1/2015 | Wong | H01L 29/7787 257/76 |
| 2015/0060873 | A1* | 3/2015 | Chiu | H01L 29/778 257/76 |

FOREIGN PATENT DOCUMENTS

| JP | 2000-269327 A | 9/2000 |
| JP | 2004-55677 A1 | 2/2004 |
| JP | 2004-95637 A1 | 3/2004 |
| JP | 2005-317801 A | 11/2005 |
| JP | 2006-210499 A1 | 8/2006 |
| JP | 2009-272433 A1 | 11/2009 |
| TW | 200527541 A | 8/2005 |
| TW | 201007952 A1 | 2/2010 |
| TW | 201250786 A1 | 12/2012 |
| WO | 2007020688 A1 | 2/2007 |

OTHER PUBLICATIONS

Office Action of European Patent Application 14162274.6 dated Jun. 12, 2015.
Takahashi, T., et al., "improvement in High Frequency and Noise Characteristics of InP-Based HEMTs by Reducing Parasitic Capacitance," Indium Phosphide and Related Materials (2008), 20th International Conference on IEEE, pp. 1-4.
Extended European Search Report dated Sep. 12, 2014 in the corresponding European patent application No. 14162274.6-1552.
Office Action of Japanese Patent Application No. 2013-086099 dated Oct. 18, 2016; translation of the relevant part of the Office Action.
Office Action of Chinese Patent Application No. 201410132262.3 dated Jan. 20, 2017; full translation of the Office Action.
Japanese Patent Application No. 2013-086099: Notification of Reasons for Refusal dated Mar. 28, 2017.

* cited by examiner

APPLICATION OF ULTRAVIOLET RAYS

SEMICONDUCTOR DEVICE AND METHOD OF MANUFACTURING THE SAME

CROSS-REFERENCE TO RELATED APPLICATION

This application is a Divisional of U.S. application Ser. No. 14/219,375, filed Mar. 19, 2014 which is based upon and claims the benefit of priority of the prior Japanese Patent Application No. 2013-086099, filed on Apr. 16, 2013, the entire contents of both of which are incorporated herein by reference in their entireties.

FIELD

The embodiments discussed herein are directed to a semiconductor device and a method of manufacturing the same.

BACKGROUND

Compound semiconductor devices, in particular, nitride semiconductor devices are actively developed as high-withstand-voltage and high-power semiconductor devices by utilizing their characteristics such as a high saturation electron velocity and a wide band gap. Many reports have been made on field-effect transistors, in particular, HEMTs (High Electron Mobility Transistors) as the nitride semiconductor devices. In particular, an AlGaN/GaN HEMT using GaN as an electron transit layer and using AlGaN as an electron supply layer has been drawing attention. In the AlGaN/GaN HEMT, a distortion resulting from a difference in lattice constant between GaN and AlGaN occurs in AlGaN. Owing to piezoelectric polarization caused by the distortion and spontaneous polarization of AlGaN, high-concentration two-dimensional electron gas (2DEG) is obtained. Therefore, a high-withstand-voltage and high-power can be realized.

In recent years, HEMTs have excellent high-speed characteristics and are thus applied to signal processing circuits of optical communication systems, other high-speed digital circuits and so on. The HEMTs have excellent low-noise characteristics and are thus expected to be applied to amplifiers in a microwave or millimeter-wave band.

On the other hand, to improve the high-frequency characteristics of the HEMTs, it is necessary to increase the value of a cutoff frequency (amplification limit frequency) $f_T$ of current gain that is the upper limit of the frequency of the amplification relating to the current gain of a transistor. For the increase, it is necessary to increase the value of a mutual conductance gm that is an element parameter relating to the amplification factor of an element and to decrease the capacitance between a gate electrode and a source electrode by reducing the gate length.

It is particularly necessary to decrease the parasitic capacitance due to an interlayer insulating film (protective film) around a gate electrode so as to prevent the high-frequency characteristics from worsening even when the HEMTs are integrated (into a MMIC, for instance). To decrease the parasitic capacitance, it is effective to reduce the dielectric constant of the interlayer insulating film and to remove the interlayer insulating film around the gate electrode.

For example, in Patent Documents 1 to 4, the interlayer insulating film around the gate electrode is removed as follows.

First, a filled material layer is formed around the gate electrode, and then an interlayer insulating film is formed so as to cover the entire surface. Next, connection holes are formed in the interlayer insulating film so as to expose end portions of the filled material layer. Then, the filled material layer is dissolved and removed through the connection holes. Thus, the interlayer insulating film is formed so that a cavity is formed around the gate electrode.

Patent Document 1: Japanese Laid-open Patent Publication No. 2004-95637
Patent Document 2: Japanese Laid-open Patent Publication No. 2006-210499
Patent Document 3: Japanese Laid-open Patent Publication No. 5-335343
Patent Document 4: Japanese Laid-open Patent Publication No. 2009-272433

By the methods of Patent Documents 1 to 4, however, the interlayer insulating film around the gate electrode can be made into the cavity but the interlayer insulating film remains above the source electrode and the drain electrode, so that complete decrease of the parasitic capacitance cannot be achieved. This is because if the filled material is formed also on the source electrode and the drain electrode and then dissolved and removed, a part that supports the interlayer insulating film is lost and the remaining interlayer insulating film fails onto the electrodes.

As described above, in the prior art, it is difficult to make the interlayer insulating film into the cavity at a maximum to decrease as much as possible the parasitic capacitance, bringing about a problem of inhibiting the improvement in maximum operating frequency.

SUMMARY

According to an aspect of the embodiment, a semiconductor device includes: a first electrode; a second electrode; an interlayer insulating film formed above the first electrode and the second electrode; and connection parts electrically connected to the first electrode and the second electrode respectively, wherein a cavity is formed between the interlayer insulating film and a surface of the first electrode, a surface of the second electrode, and parts of surfaces of the connection parts.

According to an aspect of the embodiment, a method of manufacturing a semiconductor device includes: forming a first electrode; forming a second electrode; covering the first electrode and the second electrode with a filled material; forming an interlayer insulating film covering the filled material; forming connection parts which penetrate the filled material and the interlayer insulating film and are electrically connected to the first electrode and the second electrode; and removing the filled material to form a cavity between the interlayer insulating film and a surface of the first electrode, a surface of the second electrode, and parts of surfaces of the connection parts.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

First Embodiment

In this embodiment, an AlGaN/GaN HEMT of a nitride semiconductor that is a compound semiconductor is disclosed as a semiconductor device.

FIG. 1A to FIG. 4B are schematic sectional views illustrating a method of manufacturing the AlGaN/GaN HEMT according to a first embodiment in order of steps.

Figure 1A:
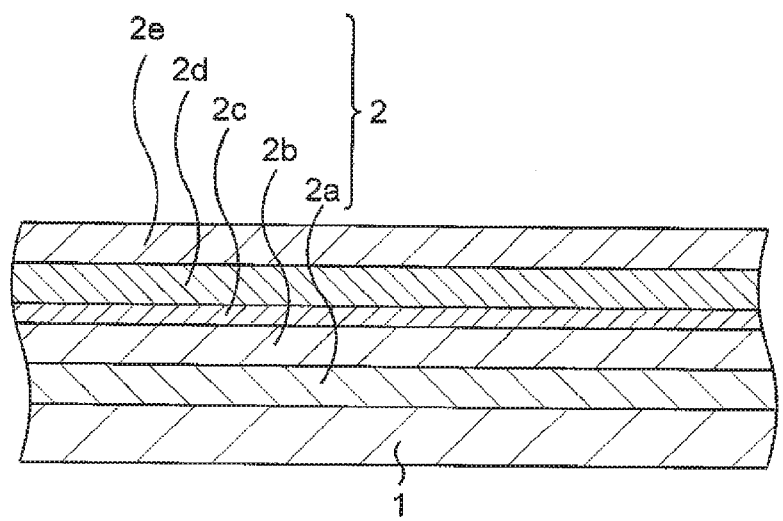
FIG. 1A to FIG. 1C are schematic sectional views illustrating a method of manufacturing an AlGaN/GaN HEMT according to a first embodiment in order of steps.

First, as illustrated in FIG. 1A, a compound semiconductor stacked structure 2 as a stacked body of a plurality of compound semiconductor layers is formed on, for example, a semi-insulating SiC substrate 1 as a growth substrate. As the growth substrate, a Si substrate, a sapphire substrate, a GaAs substrate, a GaN substrate, or the like may be used instead of the SiC substrate. The conductivity of the substrate may be either semi-insulating or conductive.

The compound semiconductor stacked structure 2 includes a buffer layer 2a, an electron transit layer 2b, a spacer layer 2c, an electron supply layer 2d, and a cap layer 2e.

In the completed AlGaN/GaN HEMT, two-dimensional electron gas (2DEG) is generated, during operation thereof, in the vicinity of an interface, of the electron transit layer 2b, with the electron supply layer 2d (to be exact, in the vicinity of an interface, of the electron transit layer 2b, with the spacer layer 2c). The 2DEG is generated on the basis of a lattice constant difference between the compound semiconductor (here, GaN) of the electron transit layer 2b and the compound semiconductor (here, AlGaN) of the electron supply layer 2d.

In detail, on the SiC substrate 1, the following compound semiconductors are grown by, for example, an MOVPE (Metal Organic Vapor Phase Epitaxy) method. An MBE (Molecular Beam Epitaxy) method or the like may be used instead of the MOVPE method.

On the SiC substrate 1, AlN is grown to a thickness of about 200 nm, i (intentionally undoped)-GaN is grown to a thickness of about 1 μm, i-AlGaN is grown to a thickness of about 5 nm, n-AlGaN is grown to a thickness of about 30 nm, and n-GaN is grown to a thickness of about 10 nm in order. Thus, the buffer layer 2a, the electron transit layer 2b, the spacer layer 2c, the electron supply layer 2d, and the cap layer 2e are formed. As the buffer layer 2a, AlGaN may be used instead of AlN, or GaN may be grown at a low temperature.

As a growth condition of AlN, mixed gas of trimethylaluminum (TMAl) gas and ammonia ($NH_3$) gas is used as a source gas. As a growth condition of GaN, mixed gas of trimethylgallium (TMGa) gas and $NH_3$ gas is used as a source gas. As a growth condition of AlGaN, mixed gas of TMAl gas, TMGa gas, and $NH_3$ gas is used as a source gas. According to the compound semiconductor layers to be grown, whether or not to supply the TAMl gas being an Al source and the TMGa gas being a Ga source and flow rates thereof are appropriately set. The flow rate of the ammonia gas being a common source is set to about 100 ccm to about 10 LM. Further, growth pressure is set to about 50 Torr to about 300 Torr, and growth temperature is set to about 1000° C. to about 1200° C.

For growing AlGaN, GaN as n-type, that is, for forming the electron supply layer 2d and the cap layer 2e, for example, $SiH_4$ gas containing Si as n-type impurity, for example, is added to the source gas at a predetermined flow rate, thereby doping GaN and AlGaN with Si. A doping concentration of Si is set to about $1\times10^{18}/cm^3$ to about $1\times10^{20}/cm^3$, for example, about $5\times10^{18}/cm^3$.

Figure 1B:
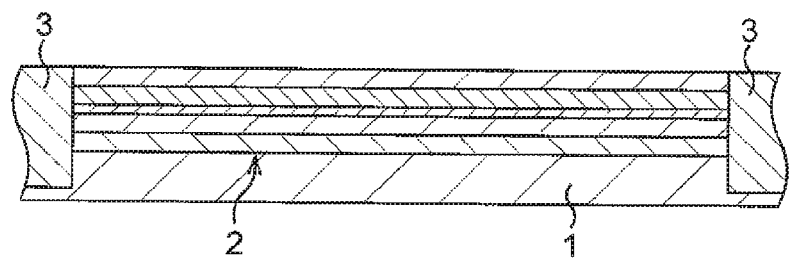

Subsequently, element isolation regions 3 are formed as illustrated in FIG. 1B.

In detail, argon (Ar), for instance, is ion-implanted to portions to be inactive regions in the compound semiconductor stacked structure 2. The element isolation regions 3 are thereby formed in the compound semiconductor stacked structure 2 and surface layer portions of the SiC substrate 1. The element isolation regions 3 demarcate an element region (transistor region) of the AlGaN/GaN HEMT on the compound semiconductor stacked structure 2.

Incidentally, the element isolation may be performed using, instead of the above implantation method, for example, an STI (Shallow Trench Isolation) method. In this event, for example, chlorine-based etching gas is used for dry etching of the compound semiconductor stacked structure 2.

Figure 1C:
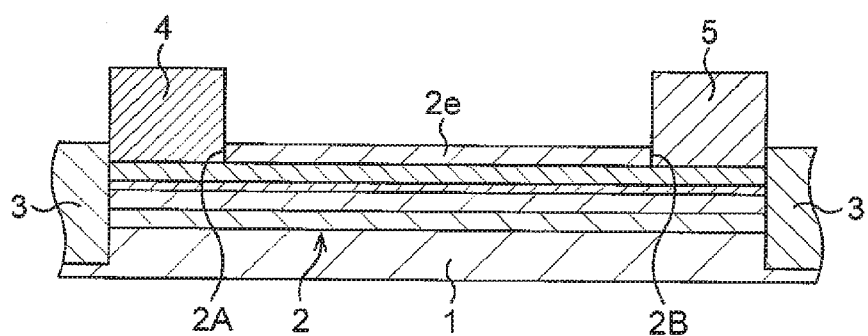

Subsequently, as illustrated in FIG. 1C, a source electrode 4 and a drain electrode 5 are formed.

In detail, first, formation planned portions for the source electrode and the drain electrode in the cap layer 2e of the compound semiconductor stacked structure 2 are removed by lithography and dry etching. Thus, electrode recesses 2A, 2B are formed in the cap layer 2e of the compound semiconductor stacked structure 2.

Then, a resist mask for forming the source electrode and the drain electrode is formed. A resist is applied on the compound semiconductor stacked structure 2 and processed by the lithography. Thus, openings which expose the electrode recesses 2A, 2B are formed. Thus, a resist mask having the openings is formed.

Using this resist mask, Ti/Al (a lower layer is Ti and an upper layer is Al) for example is deposited as an electrode material by a vapor deposition method for example, on the resist mask including the inside of the openings which expose the formation planned portions for the source electrode and the drain electrode. The thickness of Ti is about 20 nm, and the thickness of Al is about 200 nm. By a lift-off method, the resist mask and Ti/Al deposited thereon are removed. Thereafter, the SiC substrate 1 is heat-treated at a temperature of about 400° C. to about 1000° C., for example, about 600° C., in a nitrogen atmosphere for example, thereby bringing the remaining Ti/Al into ohmic contact with the electron supply layer 2d. As long as the ohmic contact of Ti/Al with the electron supply layer 2d can be obtained, there may be cases where the heat treatment is unnecessary. The source electrode 4 and the drain electrode 5 are thereby formed which fill the electrode recesses 2A, 2B and are brought into ohmic contact with the electron supply layer 2d.

Figure 2A:
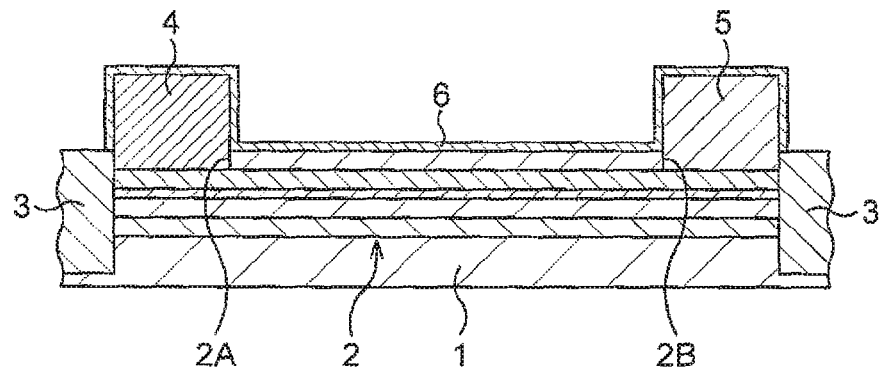
FIG. 2A to FIG. 2C are schematic sectional views illustrating the method of manufacturing the AlGaN/GaN HEMT according to the first embodiment in order of steps subsequent to FIG. 1C.

Subsequently, as illustrated in FIG. 2A, a protective film 6 for the source electrode 4 and the drain electrode 5 is formed.

In detail, an insulating film, for example, a silicon nitride film is deposited on the compound semiconductor stacked structure 2 to a thickness of about 40 nm, for example, by a PECVD method so as to cover the source electrode 4 and the drain electrode 5. The deposited silicon nitride film is processed by the lithography and dry etching so that the silicon nitride film remains in the element region. The protective film 6 is thereby formed.

Figure 2B:
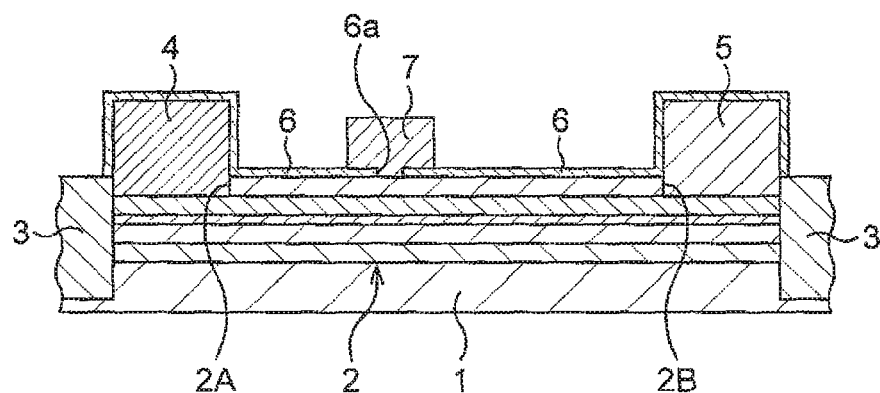

Subsequently, as illustrated in FIG. 2B, a gate electrode 7 is formed.

In detail, first, a formation planned portion for the gate electrode in the protective film 6 is removed by the lithography and dry etching. An electrode recess 6a is thereby formed in the protective film 6.

Then, a resist mask for forming the gate electrode is formed. A resist is applied on the entire surface. Here, for example, an eaves structure two-layer resist is used, which is suitable for the vapor deposition method and the lift-off method. The applied resist is processed by the lithography. Thus, a resist mask having an opening which exposes the electrode recess 6a that is the formation planned portion for the gate electrode is formed.

Then, Ni/Au (a lower layer is Ni and an upper layer is Au) for example is deposited as an electrode material using the resist mask by the vapor deposition method for example, on the resist mask including the inside of the opening. The thickness of Ni is about 30 nm, and the thickness of Au is about 400 nm. By the lift-off method, the resist mask and Ni/Au deposited thereon are removed. The gate electrode 7 is thereby formed on the protective film 6 while filling the electrode recess 6a. The gate electrode 7 is preferably formed at a position biased closer to the source electrode 4 than to the drain electrode 5 as illustrated in FIG. 2B.

Note that as the gate electrode 7, a gate electrode may be formed which has a lower portion being narrow (fine gate) and projecting upward from the protective film 6 and has an upper portion being wide (over gate).

Figure 2C:
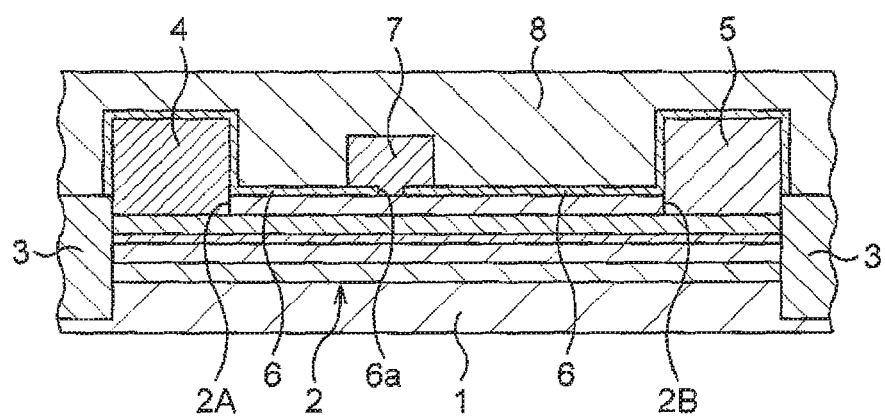

Subsequently, as illustrated in FIG. 2C, an organic film 8 is formed.

In detail, a filled material is formed entirely on the surface of the compound semiconductor stacked structure 2 so as to cover the source electrode 4, the drain electrode 5, and the gate electrode 7. As the filled material, a photolytic material, which is not particularly limited, for example, an organic material may be used as long as it has a $C_xH_y$ skeletal structure that is decomposed by ultraviolet rays with a wavelength of about 250 nm or more and 400 nm or less. The organic material is applied, for example, by the spin coating method. Note that polypropylene, polycarbonate or the like may also be used as the filled material. The organic film 8 which embeds the gate electrode 7 is thereby formed on the compound semiconductor stacked structure 2.

Figure 3A:
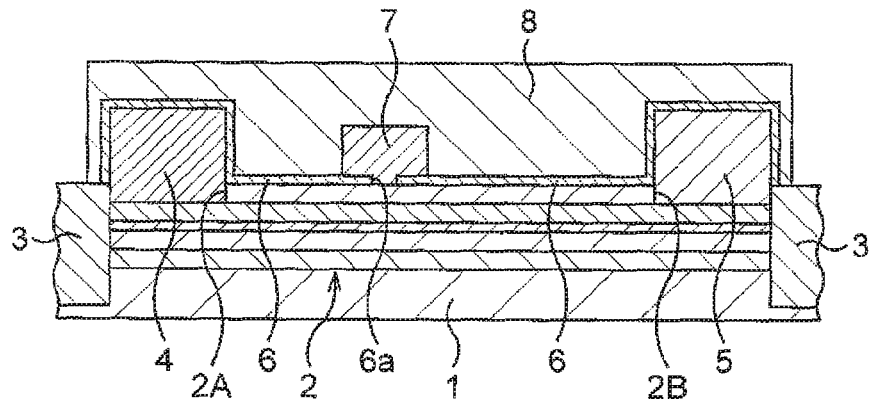
FIG. 3A to FIG. 3C are schematic sectional views illustrating the method of manufacturing the AlGaN/GaN HEMT according to the first embodiment in order of steps subsequent to FIG. 2C.

Subsequently, as illustrated in FIG. 3A, the organic film 8 is processed.

In detail, the organic film 8 is processed by the lithography and dry etching so that the organic film 8 remains at a predetermined portion. In this embodiment, the organic film 8 is left at a formation planned portion for a later-described cavity, namely, for example, at a portion covering the top of the protective film 6 so as to include the gate electrode 7, the source electrode 4, and the drain electrode 5.

Figure 3B:
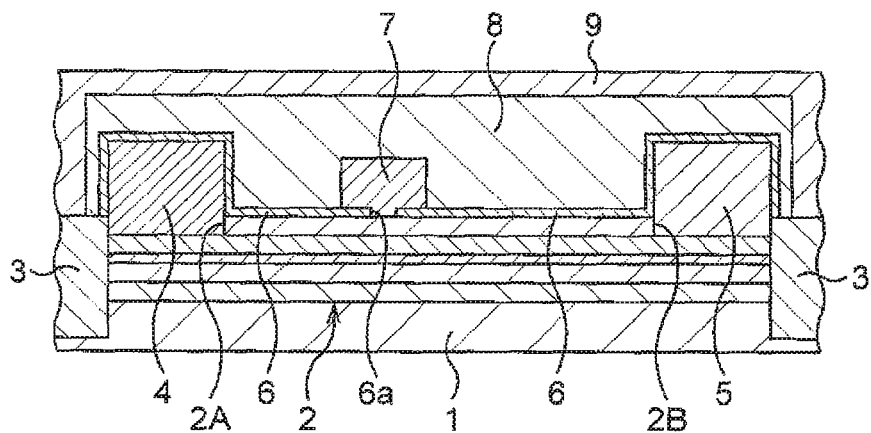

Subsequently, as illustrated in FIG. 3B, an interlayer insulating film 9 is formed.

In detail, a porous insulating material that has a property of transmitting ultraviolet rays and is a low dielectric constant material is formed entirely on the surface of the compound semiconductor stacked structure 2 so as to cover the organic film 8. As the porous insulating material, for example, porous silica is used. Other than porous silica, organosiloxane or siloxane hydroxide containing Si as a component or both of them can also be used. Further, as the porous insulating material, organic polymer containing Si as a component may also be used. The interlayer insulating film 9 covering the organic film 8 is thereby formed above the compound semiconductor stacked structure 2.

Figure 3C:
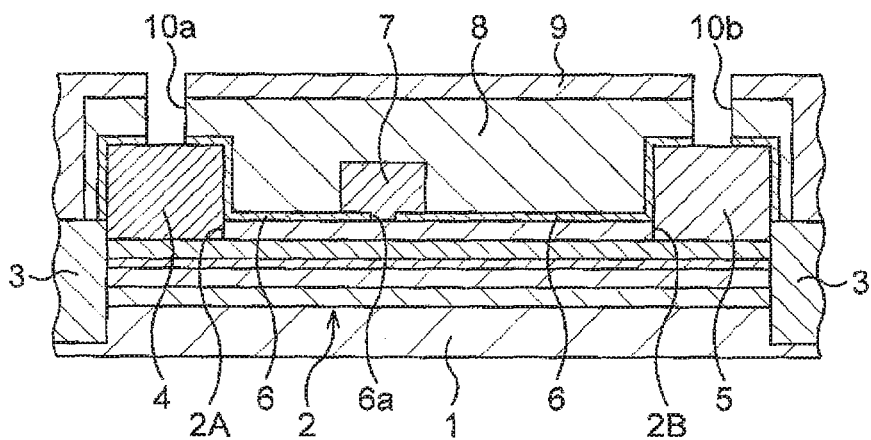

Subsequently, as illustrated in FIG. 3C, contact holes 10a, 10b are formed in the protective film 6, the organic film 8, and the interlayer insulating film 9.

In detail, the protective film 6, the organic film 8, and the interlayer insulating film 9 are processed by the lithography and dry etching. Thus, contact holes which expose a part of the surface of the source electrode 4, a part of the surface of the drain electrode 5, and a part of the surface of the gate electrode 7 respectively are formed in the protective film 6, the organic film 8, and the interlayer insulating film 9. In FIG. 3C, only the contact holes 10a, 10b which expose the part of the surface of the source electrode 4 and the part of the surface of the drain electrode 5 are illustrated.

Figure 4A:
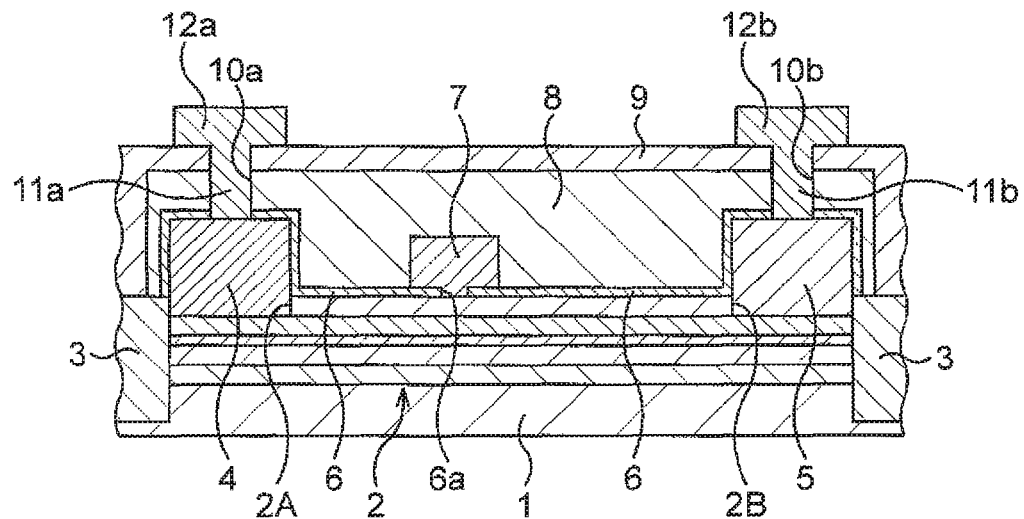
FIG. 4A and FIG. 4B are schematic sectional views illustrating the method of manufacturing the AlGaN/GaN HEMT according to the first embodiment in order of steps subsequent to FIG. 3C.

Subsequently, as illustrated in FIG. 4A, wirings 12a, 12b are formed.

In detail, for example, TiW/Au is first deposited as a conductive film, here, a two-layer metal film on the entire surface of the interlayer insulating film 9 by a sputtering method so as to fill the contact holes 10a, 10b. The metal film is formed such that TiW is formed as a lower layer on the interlayer insulating film 9 so as to cover the inner wall surfaces of the contact holes 10a, 10b and Au is formed as an upper layer on the interlayer insulating film 9 so as to fill the contact holes 10a, 10b via TiW. Note that the metal film is formed to similarly fill the contact hole which exposes the part of the surface of the gate electrode 7.

Subsequently, a resist is applied onto the metal film and processed by the lithography to form into a resist mask having openings corresponding to desired wirings on the metal film. The openings of the resist mask are filled with Au, for example, by an Au plating method, and the resist mask is removed by ashing or wet treatment.

Then, an excessive metal film on the interlayer insulating film 9 is removed by the lithography and dry etching. The wirings 12a, 12b are thereby formed which extend on the interlayer insulating film 9 and are electrically connected to the source electrode 4 and the drain electrode 5 via connection parts 11a, 11b made by filling the contact holes 10a, 10b with TiW/Au. Note that a wiring which is electrically connected to the gate electrode 7 via a connection part made by filling the contact hole with TiW/Au is also formed similarly to the wirings 12a, 12b.

Figure 4B:
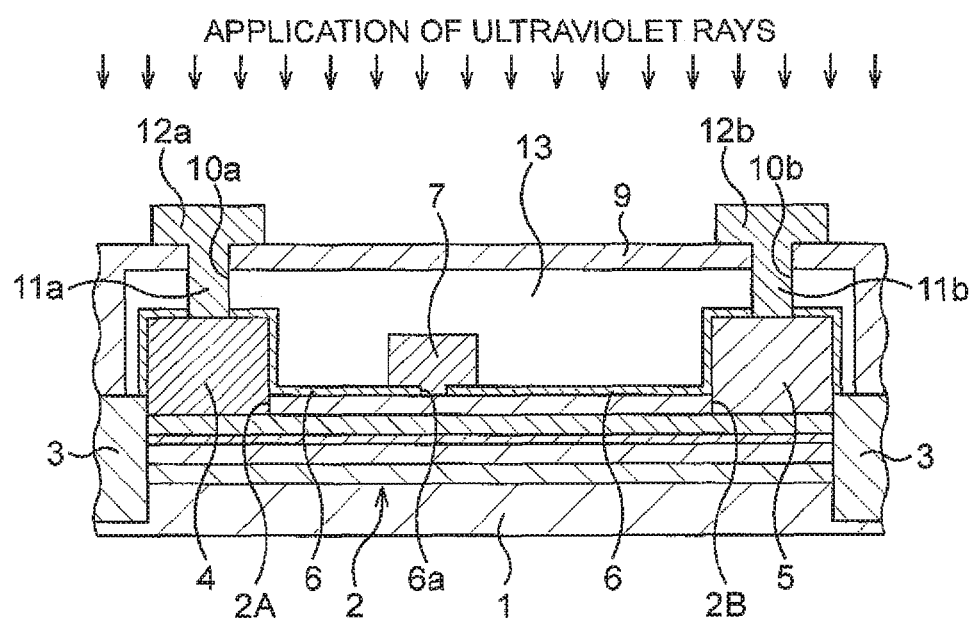

Subsequently, as illustrated in FIG. 4B, the organic film 8 is removed to form a cavity 13 in the interlayer insulating film 9.

In detail, ultraviolet rays with a wavelength of about 250 nm or more and about 400 nm or less, for example, about 254 nm are applied to the interlayer insulating film 9 in vacuum. Since the interlayer insulating film 9 is the porous insulating material that has a property of transmitting ultraviolet rays, the applied ultraviolet rays are transmitted through the interlayer insulating film 9 and reach the organic film 8. The organic film 8 is the material that has a property of being decomposed by ultraviolet rays, and is thus photolyzed by the application of the ultraviolet rays and removed through pores in the interlayer insulating film 9. Thus, the organic film 8 is removed and the cavity 13 is formed between the interlayer insulating film 9 and the protective film 6.

The cavity 13 is formed at a portion where the organic film 8 has existed. The organic film 8 has been formed at the portion covering the top of the protective film 6 so as to include the gate electrode 7, the source electrode 4, and the drain electrode 5. Therefore, the cavity 13 is formed between the interlayer insulating film 9 and the surface of the gate electrode 7, the surface of the source electrode 4, the surface of the drain electrode 5 via the protective film 6, and parts of the surfaces of the connection parts 11a, 11b (and also a part of the surface of the connection part for the gate electrode 7).

Thereafter, through post-steps such as electrical connection of the wirings 12a, 12b (and also the wiring for the gate electrode 7) and so on, the AlGaN/GaN HEMT is formed.

Hereinafter, the operation and effect achieved by the AlGaN/GaN HEMT manufactured as described above will be described on the basis of comparison with its comparative examples.

Figure 5:
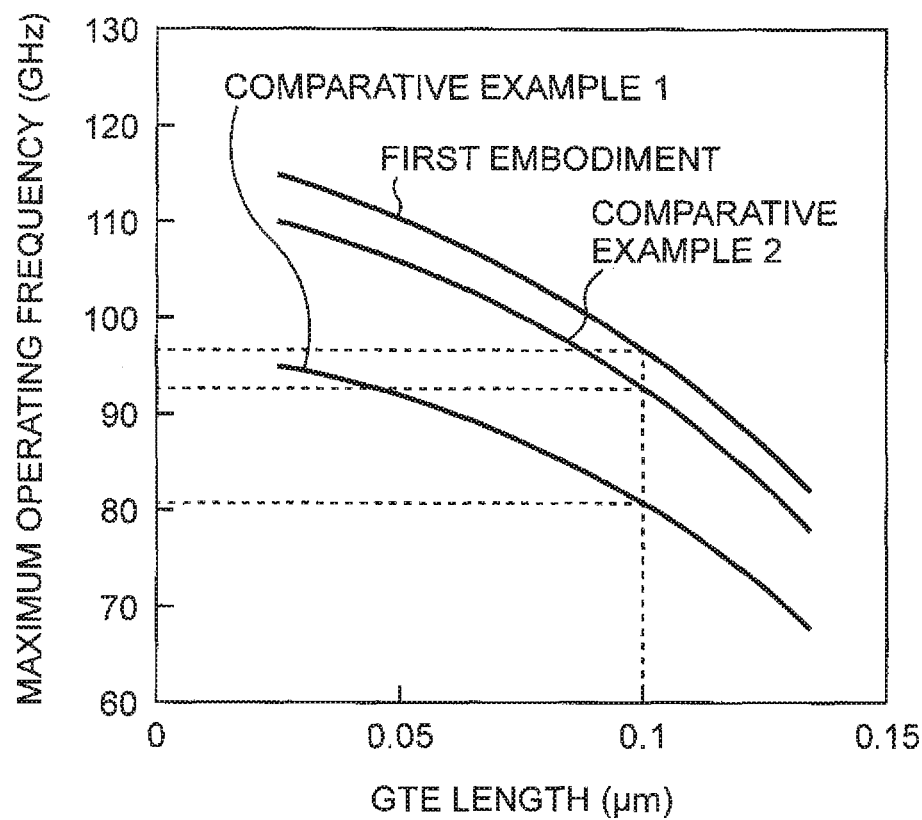
FIG. 5 is a characteristic chart representing a relation between the maximum operating frequency (GHz) and the gate length (μm) regarding the AlGaN/GaN HEMT according to the first embodiment and its comparative examples.

FIG. 5 is a characteristic chart representing a relation between the maximum operating frequency (GHz) and the gate length (m) regarding the AlGaN/GaN HEMT according to this embodiment and its comparative examples.

In FIG. 5, Comparative Example 1 is an AlGaN/GaN HEMT with a configuration having no cavity around a gate electrode (a configuration in which the gate electrode is embedded in an interlayer insulating film). Comparative Example 2 is an AlGaN/GaN HEMT with a configuration having an interlayer insulating film remaining on a source electrode and a drain electrode while having a cavity around a gate electrode. The AlGaN/GaN HEMT of Comparative Example 2 is, for example, the one according to Patent Document 1 to 4.

In the AlGaN/GaN HEMT of Comparative Example 2, a cavity is formed in an interlayer insulating film made of BDB resin (benzocyclobutene) resin covering the periphery of the gate electrode, and the interlayer insulating film remains on the source electrode and the drain electrode. In contrast, in the AlGaN/GaN HEMT in this embodiment, the interlayer insulating film having a cavity in which the interlayer insulating film does not remain on the source electrode and the drain electrode (a cavity including the gate electrode, the source electrode, and the drain electrode) is formed. The interlayer insulating film in this embodiment is made of a porous insulating material with a dielectric constant lower than that of the BDB resin.

As illustrated in FIG. 5, it is found that the maximum operating frequency larger than those of Comparative Example 1 and Comparative Example 2 can be achieved over a predetermined gate length range in this embodiment. Specifically, the maximum operating frequency is about 81 GHz in Comparative Example 1 and the maximum operating frequency is about 93 GHz in Comparative Example 2 when the gate length of the gate electrode is 0.1 µm, whereas a large maximum operating frequency of about 97 GHz is realized in this embodiment.

As described above, according to this embodiment, a highly reliable and high-withstand-voltage AlGaN/GaN HEMT excellent in high-frequency characteristics, in which the parasitic capacitance due to the interlayer insulating film around the gate electrode can be reduced as much as possible to sufficiently improve the maximum operating frequency is realized.

Modified Example

Hereinafter, a modified example of the AlGaN/GaN HEMT according to the first embodiment will be described. In this example, an AlGaN/GaN HEMT is disclosed as in the first embodiment but is different from the first embodiment in that the form of forming the cavity in the interlayer insulating film is different.

FIG. 6A to FIG. 7C are schematic sectional views illustrating main steps of a method of manufacturing the AlGaN/GaN HEMT according to the modified example of the first embodiment in order. Note that the same constituent members and the like as those in the first embodiment will be denoted by the same reference signs and a detailed description thereof will be omitted.

In this example, the steps in FIG. 1A to FIG. 2B are first performed as in the first embodiment. At this time, a gate electrode 7 is formed on a compound semiconductor stacked structure 2.

Figure 6A:
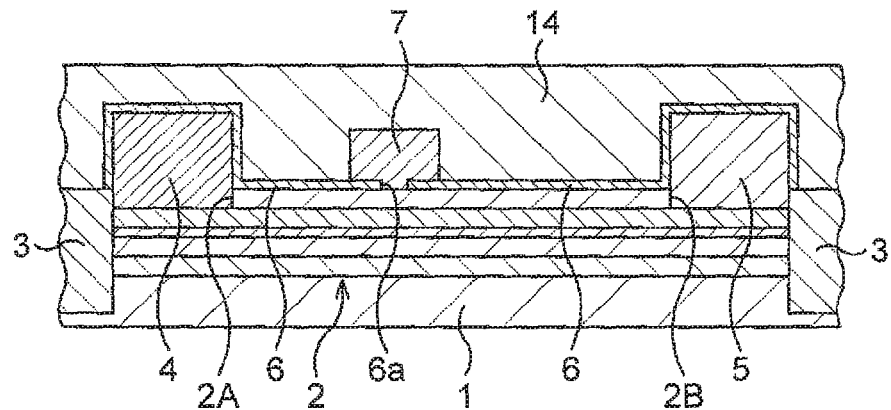
FIG. 6A to FIG. 6C are schematic sectional views illustrating main steps of a method of manufacturing an AlGaN/GaN HEMT according to a modified example of the first embodiment in order.

Subsequently, as illustrated in FIG. 6A, an organic film 14 is formed.

In detail, a filled material is formed entirely on the surface of the compound semiconductor stacked structure 2 so as to cover a source electrode 4, a drain electrode 5, and the gate electrode 7. As the filled material, a material dissolving in superheated steam or supercritical water, here, polyethylene that is an organic material is used. Polyethylene is applied, for example, by a spin coating method. As the filled material, polypropylene, polycarbonate or the like may also be used in place of polyethylene. The organic film 14 embedding the gate electrode 7 is thereby formed on the compound semiconductor stacked structure 2.

Figure 6B:
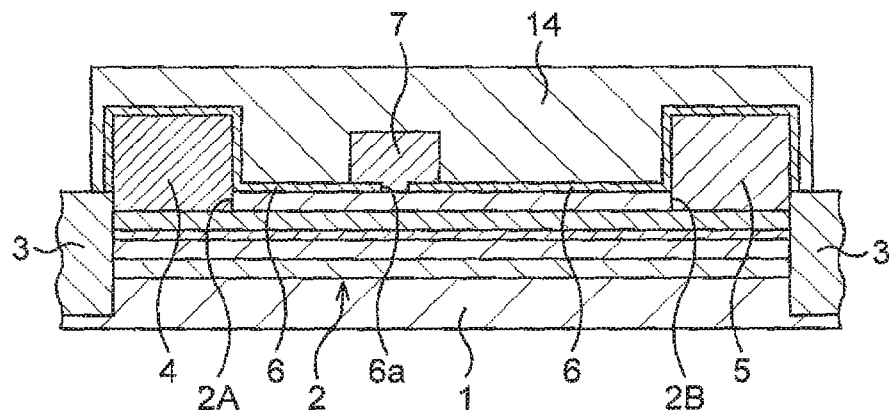

Subsequently, as illustrated in FIG. 6B, the organic film 14 is processed.

In detail, the organic film 14 is processed by the lithography and dry etching so that the organic film 14 remains at a predetermined portion. In this embodiment, the organic film 14 is left at a formation planned portion for a later-described cavity, namely, for example, a portion covering the top of the protective film 6 so as to include the gate electrode 7, the source electrode 4, and the drain electrode 5.

Figure 6C:
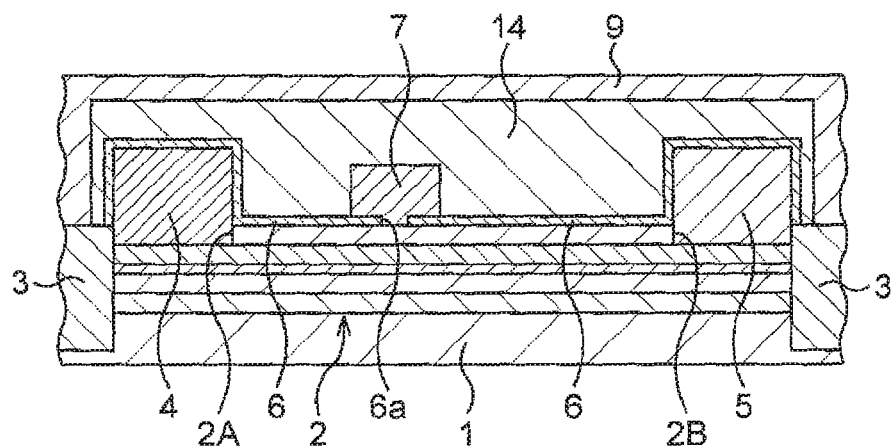

Subsequently, as illustrated in FIG. 6C, an interlayer insulating film 9 is formed.

In detail, a porous insulating material that has a property of transmitting superheated steam or supercritical water and is a low dielectric constant material is formed entirely on the surface of the compound semiconductor stacked structure 2 so as to cover the organic film 14. As the porous insulating material, for example, porous silica is used. Other than porous silica, organosiloxane or siloxane hydroxide containing Si as a component or both of them can also be used. Further, as the porous insulating material, organic polymer containing Si as a component may also be used. The interlayer insulating film 9 covering the organic film 14 is thereby formed above the compound semiconductor stacked structure 2.

Water becomes supercritical water when it increases in temperature and pressure over the critical point (saturated steam). On the other hand, in a region of the critical pressure or less, water becomes water in gas phase, namely, heated steam or subcritical water.

Figure 7A:
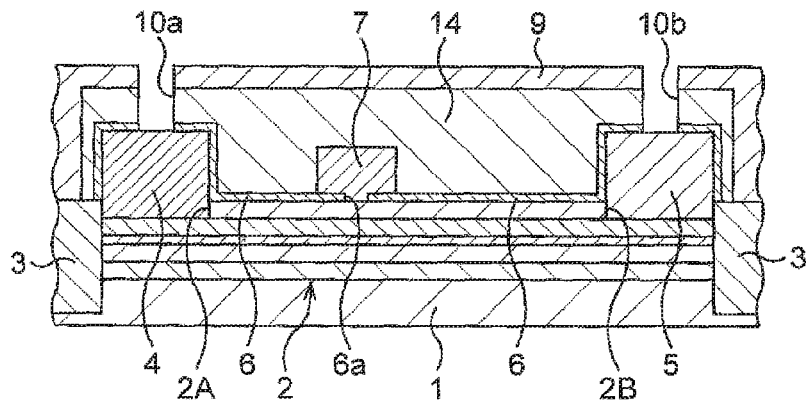
FIG. 7A to FIG. 7C are schematic sectional views illustrating main steps of the method of manufacturing the AlGaN/GaN HEMT according to the modified example of the first embodiment in order subsequent to FIG. 6C.

Subsequently, as illustrated in FIG. 7A, contact holes 10a, 10b are formed in the protective film 6, the organic film 14, and the interlayer insulating film 9.

In detail, the protective film 6, the organic film 14, and the interlayer insulating film 9 are processed by the lithography and dry etching. Thus, contact holes which expose a part of the surface of the source electrode 4, a part of the surface of the drain electrode 5, and a part of the surface of the gate electrode 7 respectively are formed in the protective film 6, the organic film 14, and the interlayer insulating film 9. In FIG. 7A, only the contact holes 10a, 10b which expose the part of the surface of the source electrode 4 and the part of the surface of the drain electrode 5 are illustrated.

Figure 7B:
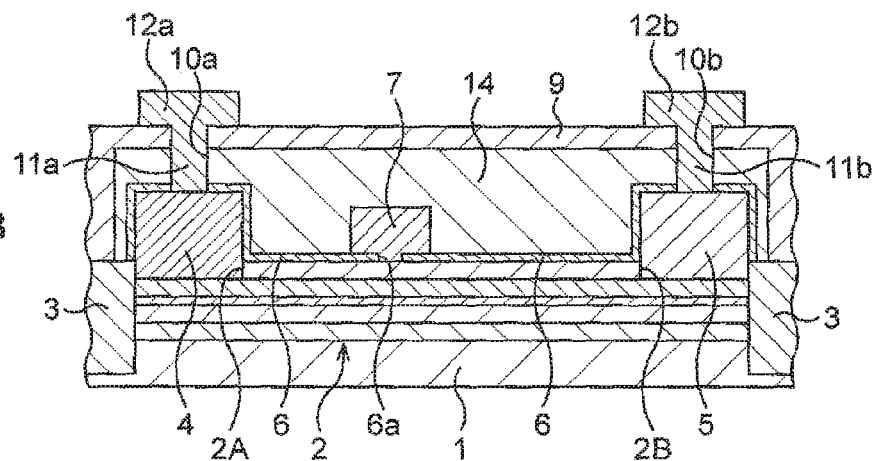

Subsequently, as illustrated in FIG. 7B, wirings 12a, 12b are formed.

In detail, for example, TiW/Au is first deposited as a conductive film, here, a two-layer metal film on the entire surface of the interlayer insulating film 9 by the sputtering method so as to fill the contact holes 10a, 10b. The metal film is formed such that TiW is formed as a lower layer on the interlayer insulating film 9 so as to cover the inner wall surfaces of the contact holes 10a, 10b and Au is formed as an upper layer on the interlayer insulating film 9 so as to fill the contact holes 10a, 10b via TiW. Note that the metal film is formed to similarly fill the contact hole which exposes the part of the surface of the gate electrode 7.

Subsequently, a resist is applied onto the metal film and processed by the lithography to form into a resist mask having openings corresponding to desired wirings on the metal film. The openings of the resist mask are filled with Au, for example, by the Au plating method, and the resist mask is removed by the ashing or wet treatment.

Then, an excessive metal film on the interlayer insulating film 9 is removed by the lithography and dry etching. The wirings 12a, 12b are thereby formed which extend on the interlayer insulating film 9 and are electrically connected to the source electrode 4 and the drain electrode 5 via connection parts 11a, 11b made by filling the contact holes 10a, 10b with TiW/Au. Note that a wiring which is electrically connected to the gate electrode 7 via a connection part made by filling the contact hole with TiW/Au is also formed similarly to the wirings 12a, 12b.

Figure 7C:
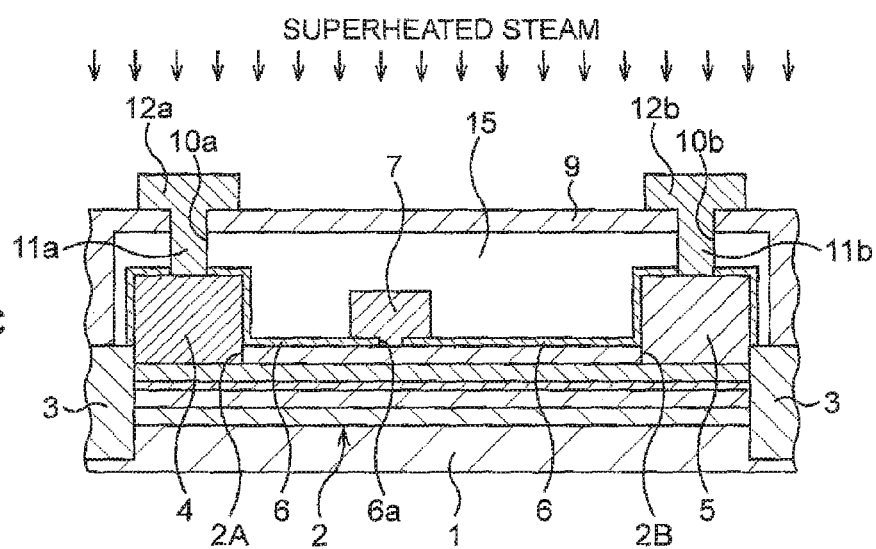

Subsequently, as illustrated in FIG. 7C, the organic film 14 is removed to form a cavity 15 in the interlayer insulating film 9.

In detail, superheated steam at about 200° C. to about 300° C., for example, about 250° C. is supplied to the interlayer insulating film 9. Since the interlayer insulating film 9 is the porous insulating material that has a property of transmitting superheated steam, the supplied superheated steam is transmitted through the interlayer insulating film 9 and reaches the organic film 14. The organic film 14 is the material that has a property of dissolving in superheated steam, and is thus dissolved by the supply of the superheated steam and is removed through pores in the interlayer insulating film 9. Thus, the organic film 14 is removed and the cavity 15 is formed between the interlayer insulating film 9 and the protective film 6.

Instead of supplying the superheated steam, supercritical water at about 200° C. to about 300° C., for example, about 250° C. may be supplied to the interlayer insulating film 9. In this case, the organic film 14 is dissolved by the supply of the supercritical water and is removed through pores in the interlayer insulating film 9. Thus, the organic film 14 is removed and the cavity 15 is formed between the interlayer insulating film 9 and the protective film 6.

The cavity 15 is formed at a portion where the organic film 14 has existed. The organic film 14 has been formed at the portion covering the top of the protective film 6 so as to include the gate electrode 7, the source electrode 4, and the drain electrode 5. Therefore, the cavity 15 is formed between the interlayer insulating film 9 and the surface of the gate electrode 7, the surface of the source electrode 4, the surface of the drain electrode 5 via the protective film 6, and parts of the surfaces of the connection parts 11a, 11b (and also a part of the surface of the connection part for the gate electrode 7).

Thereafter, through post-steps such as electrical connection of the wirings 12a, 12b (and also the wiring for the gate electrode 7) and so on, the AlGaN/GaN HEMT is formed.

As described above, according to this example, a highly reliable and high-withstand-voltage AlGaN/GaN HEMT excellent in high-frequency characteristics, in which the parasitic capacitance due to the interlayer insulating film around the gate electrode can be reduced as much as possible to sufficiently improve the maximum operating frequency is realized.

Other Embodiments

In the first embodiment and its modified example, the AlGaN/GaN HEMTs are exemplified as the compound semiconductor device. As the compound semiconductor device, the present invention is applicable to the following HEMTs, besides the AlGaN/GaN HEMT.

Other HEMT Example 1

In this example, an InAlN/GaN HEMT is disclosed as the compound semiconductor device.

InAlN and GaN are compound semiconductors whose lattice constants can be made close to each other by the composition. In this case, in the above-described first embodiment and its modified example, the electron transit layer is made of i-GaN, the spacer layer is made of i-AlN, the electron supply layer is made of n-InAlN, and the cap layer is made of n-GaN. Further, in this case, almost no piezoelectric polarization occurs, and therefore, two-dimensional electron gas is generated mainly by spontaneous polarization of InAlN.

According to this example, a highly reliable and high-withstand-voltage InAlN/GaN HEMT excellent in high-frequency characteristics, in which the parasitic capacitance due to the interlayer insulating film around the gate electrode can be reduced as much as possible to sufficiently improve the maximum operating frequency is realized similarly to the above-described AlGaN/GaN HEMT.

Other HEMT Example 2

In this example, an InAlGaN/GaN HEMT is disclosed as the compound semiconductor device.

GaN and InAlGaN are compound semiconductors, with the latter capable of having a smaller lattice constant than that of the former by the composition. In this case, in the above-described first embodiment and its modified example, the electron transit layer is made of i-GaN, the spacer layer is made of i-AlN, the electron supply layer is made of n-InAlGaN, and the cap layer is made of n-GaN.

According to this example, a highly reliable and high-withstand-voltage InAlNGaN/GaN HEMT excellent in high-frequency characteristics, in which the parasitic capacitance due to the interlayer insulating film around the gate electrode can be reduced as much as possible to sufficiently improve the maximum operating frequency is realized similarly to the above-described AlGaN/GaN HEMT.

Second Embodiment

In this embodiment, a MOS transistor is disclosed as a semiconductor device.

FIG. 8A to FIG. 10B are schematic sectional views illustrating a method of manufacturing a MOS transistor according to a second embodiment in order of steps.

Figure 8A:
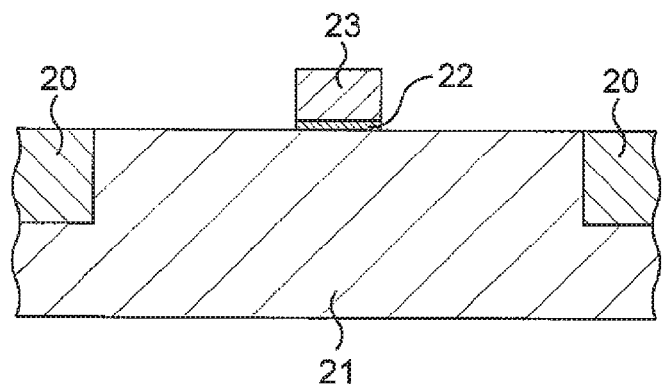
FIG. 8A to FIG. 8C are schematic sectional views illustrating a method of manufacturing a MOS transistor according to a second embodiment in order of steps.

First, as illustrated in FIG. 8A, a gate electrode 23 is formed on a Si substrate 21 via a gate insulating film 22.

In detail, element isolation regions 20 are formed, for example, by the STI (Shallow Trench Isolation) method on the Si substrate 21. The element isolation regions 20 demarcate an element region on the Si substrate 21.

Next, for example, a silicon oxide film is deposited on the Si substrate 21 by a CVD method or the like. The gate insulating film 22 is thereby formed.

Then, for example, a polycrystalline silicon is deposited on the gate insulating film by the CVD method or the like, and the gate insulating film 22 and the polycrystalline silicon are processed into an electrode shape by the lithography and dry etching. The gate electrode 23 is thereby formed on the Si substrate 21 via the gate insulating film 22.

Figure 8B:
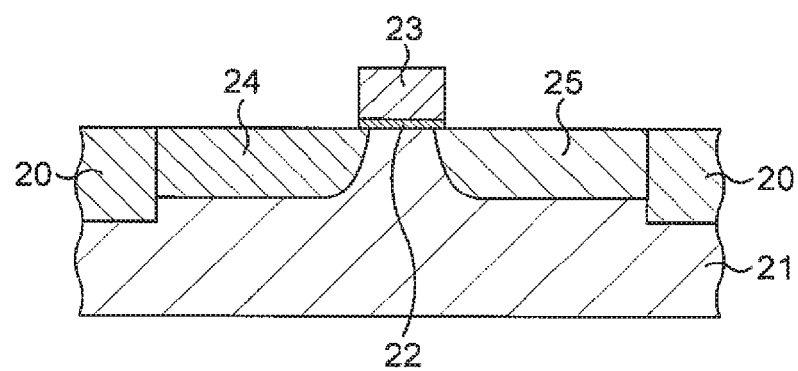

Subsequently, as illustrated in FIG. 8B, a source region 24 and a drain region 25 are formed.

In detail, for example, a p-type impurity (boron or the like) or an n-type impurity (phosphorus, arsenic or the like) is ion-implanted into the element region of the Si substrate 21 on both sides of the gate electrode 23 using the gate electrode 23 as a mask, and thermally treated. The source region 24 and the drain region 25 are thereby formed in the Si substrate 21 on both sides of the gate electrode 23.

Figure 8C:
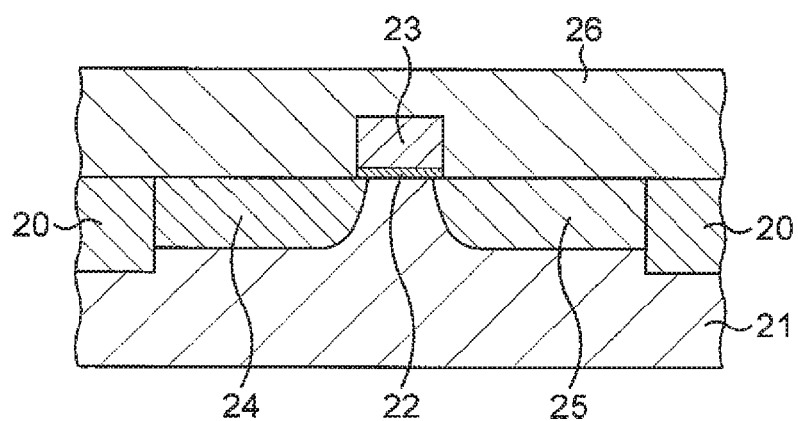

Subsequently, as illustrated in FIG. 8C, an organic film 26 is formed.

In detail, a filled material is formed entirely on the surface of the Si substrate 21 so as to cover the gate electrode 23, the source region 24, and the drain region 25. As the filled material, a photolytic material, which is not particularly limited, for example, an organic material may be used as long as it has a $C_xH_y$ skeletal structure that is decomposed by ultraviolet rays with a wavelength of about 250 nm or more and 400 nm or less. The organic material is applied, for example, by the spin coating method. Note that polypropylene, polycarbonate or the like may also be used as the filled material. The organic film 26 which embeds the gate electrode 23 is thereby formed on the Si substrate 21.

Figure 9A:
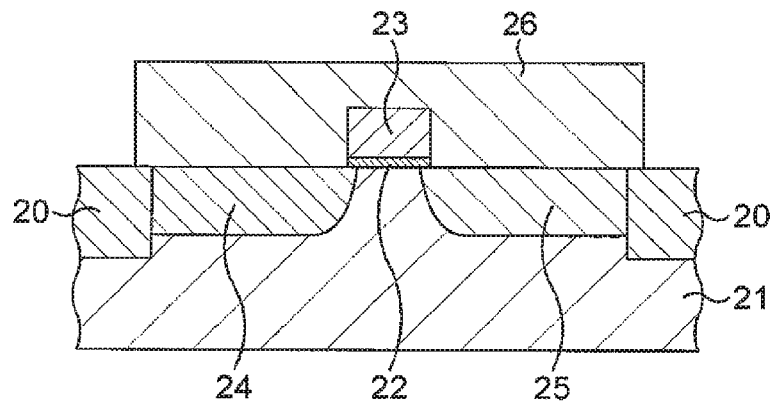
FIG. 9A to FIG. 9C are schematic sectional views illustrating the method of manufacturing the MOS transistor according to the second embodiment in order of steps subsequent to FIG. 8C.

Subsequently, as illustrated in FIG. 9A, the organic film 26 is processed.

In detail, the organic film 26 is processed by the lithography and dry etching so that the organic film 26 remains at a predetermined portion. In this embodiment, the organic film 26 is left at a formation planned portion for a later-described cavity, namely, so as to include the gate electrode 23, the source region 24, and the drain region 25.

Figure 9B:
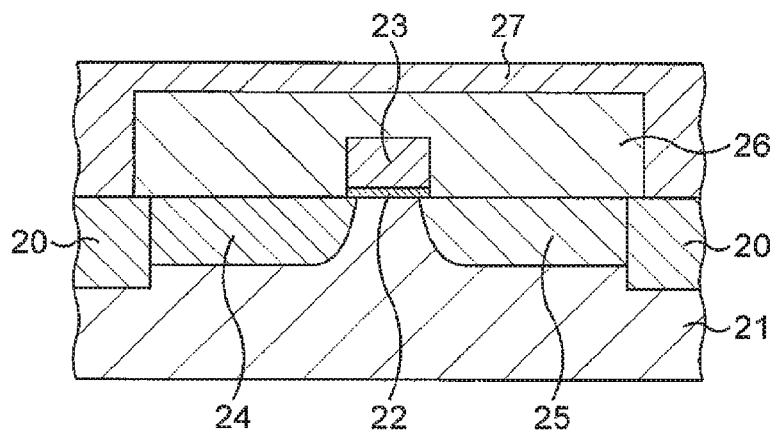

Subsequently, as illustrated in FIG. 9B, an interlayer insulating film 27 is formed.

In detail, a porous insulating material that has a property of transmitting ultraviolet rays and is a low dielectric constant material is formed entirely on the surface of the Si substrate 21 so as to cover the organic film 26. As the porous insulating material, for example, porous silica is used. Other than porous silica, organosiloxane or siloxane hydroxide containing Si as a component or both of them can also be used. Further, as the porous insulating material, organic polymer containing Si as a component may also be used. The interlayer insulating film 27 covering the organic film 26 is thereby formed above the Si substrate 21.

Figure 9C:
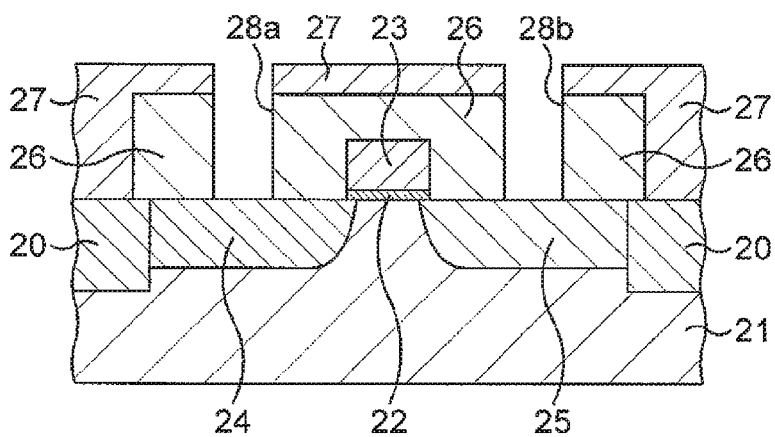

Subsequently, as illustrated in FIG. 9C, contact holes 28a, 28b are formed in the organic film 26 and the interlayer insulating film 27.

In detail, the organic film 26 and the interlayer insulating film 27 are processed by the lithography and dry etching. Thus, contact holes which expose a part of the surface of the source region 24, a part of the surface of the drain region 25, and a part of the surface of the gate electrode 23 respectively are formed in the organic film 26 and the interlayer insulating film 27. In FIG. 9C, only the contact holes 28a, 28b which expose the part of the surface of the source region 24 and the part of the surface of the drain region 25 are illustrated.

Figure 10A:
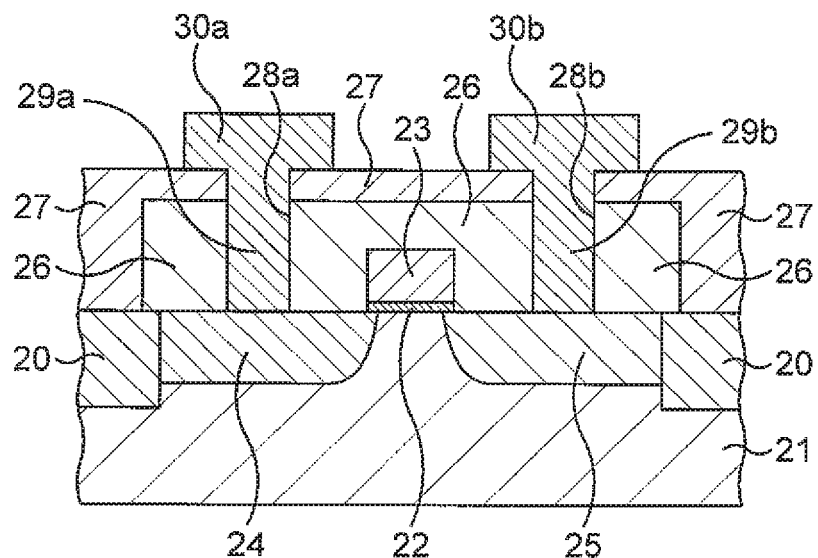
FIG. 10A and FIG. 10B are schematic sectional views illustrating the method of manufacturing the MOS transistor according to the second embodiment in order of steps subsequent to FIG. 9C.

Subsequently, as illustrated in FIG. 10A, wirings 30a, 30b are formed.

In detail, for example, TiW/Au is first deposited as a conductive film, here, a two-layer metal film on the entire surface of the interlayer insulating film 27 by the sputtering method so as to fill the contact holes 28a, 28b. The metal film is formed such that TiW is formed as a lower layer on the interlayer insulating film 27 so as to cover the inner wall surfaces of the contact holes 28a, 28b and Au is formed as an upper layer on the interlayer insulating film 27 so as to fill the contact holes 28a, 28b via TiW. Note that the metal film is formed to similarly fill the contact hole which exposes the part of the surface of the gate electrode 23.

Subsequently, a resist is applied onto the metal film and processed by the lithography to form into a resist mask having openings corresponding to desired wirings on the metal film. The openings of the resist mask are filled with Au, for example, by the Au plating method, and the resist mask is removed by the ashing or wet treatment.

Then, an excessive metal film on the interlayer insulating film 27 is removed by the lithography and dry etching. The wirings 30a, 30b are thereby formed which extend on the interlayer insulating film 27 and are electrically connected to the source region 24 and the drain region 25 via connection parts 29a, 29b made by filling the contact holes 28a, 28b with TiW/Au. Note that a wiring which is electrically connected to the gate electrode 23 via a connection part made by filling the contact hole with TiW/Au is also formed similarly to the wirings 30a, 30b.

Figure 10B:
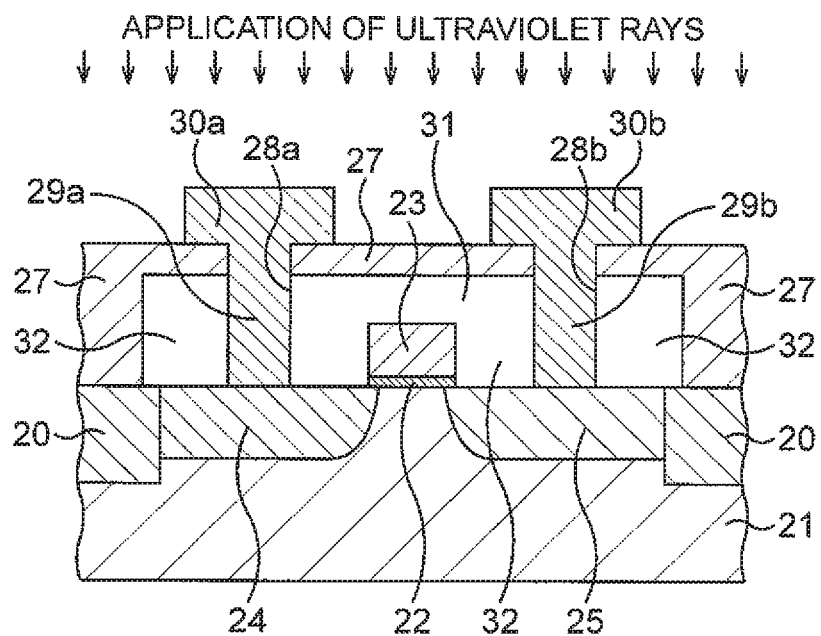

Subsequently, as illustrated in FIG. 10B, the organic film 26 is removed to form a cavity 31 in the interlayer insulating film 27.

In detail, ultraviolet rays with a wavelength of about 250 nm or more and about 400 nm or less, for example, about 254 nm are applied to the interlayer insulating film 27 in vacuum. Since the interlayer insulating film 27 is the porous insulating material that has a property of transmitting ultraviolet rays, the applied ultraviolet rays are transmitted through the interlayer insulating film 27 and reach the organic film 26. The organic film 26 is the material that has a property of being decomposed by ultraviolet rays, and is thus photolyzed by the application of the ultraviolet rays and removed through pores in the interlayer insulating film 27. Thus, the organic film 26 is removed and the cavity 31 is formed between the interlayer insulating film 27 and the gate electrode 23, the source region 24 and the drain region 25.

The cavity 31 is formed at a portion where the interlayer insulating film 27 and the organic film 26 have existed. The organic film 26 has been formed at a portion including the gate electrode 23, the source region 24 and the drain region 25. Therefore, the cavity 31 is formed between the interlayer insulating film 27 and the surface of the gate electrode 23, the surface of the source region 24, the surface of the drain region 25, and parts of the surfaces of the connection parts 29a, 29b (and also a part of the surface of the connection part for the gate electrode 23).

Thereafter, through post-steps such as electrical connection of the wirings 30a, 30b (and also the wiring for the gate electrode 23) and so on, the MOS transistor is formed.

As described above, according to this embodiment, a highly reliable MOS transistor excellent in preventing signal propagation delay, in which the parasitic capacitance due to the interlayer insulating film around the gate electrode can be reduced as much as possible to sufficiently improve the maximum operating frequency is realized.

Modified Example

Hereinafter, a modified example of the MOS transistor according to the second embodiment will be described. In this example, a MOS transistor is disclosed as in the second embodiment but is different from the second embodiment in that the form of forming the cavity in the interlayer insulating film is different.

FIG. 11A to FIG. 12C are schematic sectional views illustrating main steps of a method of manufacturing a MOS transistor a method of manufacturing the MOS transistor according to the modified example of the second embodiment in order. Note that the same constituent members and the like as those in the second embodiment will be denoted by the same reference signs and a detailed description thereof will be omitted.

In this example, the steps in FIG. 8A to FIG. 8B are first performed as in the second embodiment. At this time, a source region 24 and a drain region 25 are formed in a Si substrate 21.

Figure 11A:
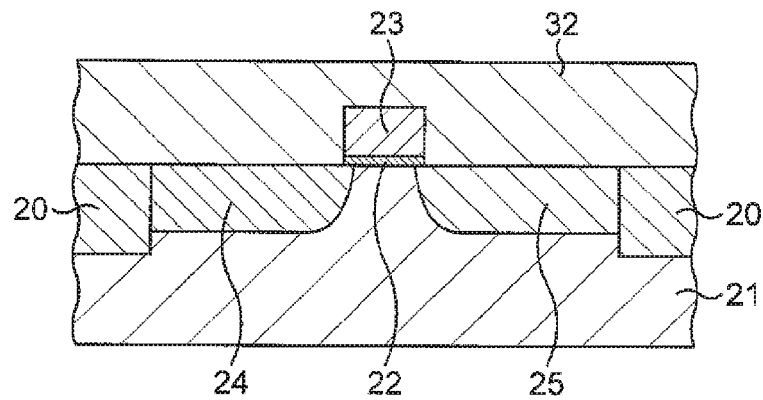
FIG. 11A to FIG. 11C are schematic sectional views illustrating main steps of a method of manufacturing a MOS transistor according to a modified example of the second embodiment in order.

Subsequently, as illustrated in FIG. 11A, an organic film 32 is formed.

In detail, a filled material is formed entirely on the surface of the Si substrate 21 so as to cover a gate electrode 23, the source region 24, and the drain region 25. As the filled material, a material dissolving in superheated steam or supercritical water, here, polyethylene that is an organic material is used. Polyethylene is applied, for example, by the spin coating method. As the filled material, polypropylene, polycarbonate or the like may also be used in place of polyethylene. The organic film 32 embedding the gate electrode 23 is thereby formed on the Si substrate 21.

Figure 11B:
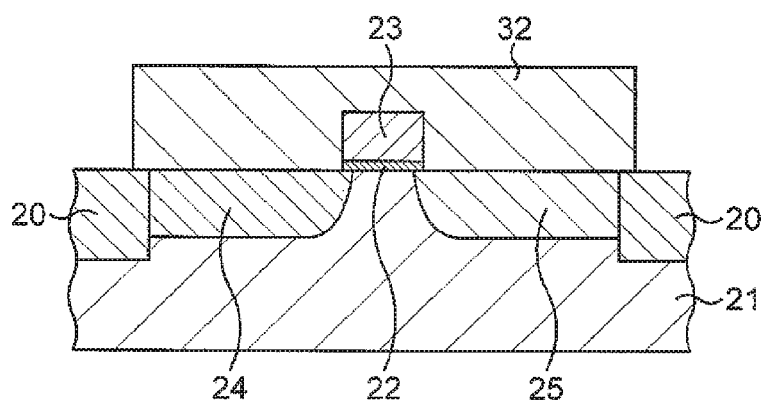

Subsequently, as illustrated in FIG. 11B, the organic film 32 is processed.

In detail, the organic film 32 is processed by the lithography and dry etching so that the organic film 32 remains at a predetermined portion. In this embodiment, the organic film 32 is left at a formation planned portion for a later-described cavity, namely, so as to include the gate electrode 23, the source region 24, and the drain region 25.

Figure 11C:
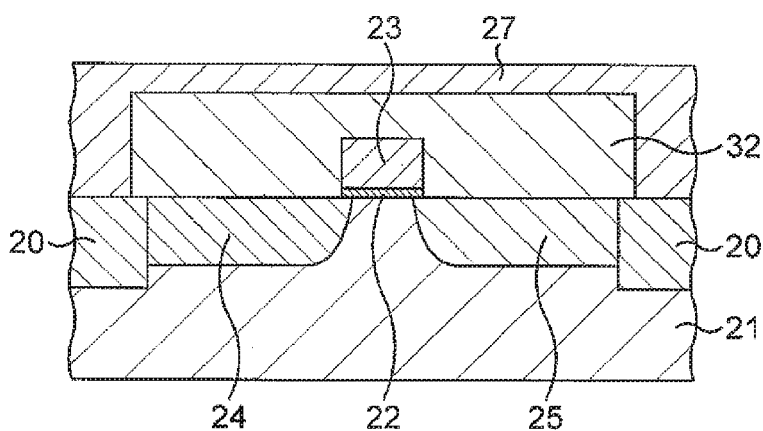

Subsequently, as illustrated in FIG. 11C, an interlayer insulating film 27 is formed.

In detail, a porous insulating material that has a property of transmitting superheated steam or supercritical water and is a low dielectric constant material is formed entirely on the surface of the Si substrate 21 so as to cover the organic film 32. As the porous insulating material, for example, porous silica is used. Other than porous silica, organosiloxane or siloxane hydroxide containing Si as a component or both of them can also be used. Further, as the porous insulating material, organic polymer containing Si as a component may also be used. The interlayer insulating film 27 covering the organic film 32 is thereby formed above the Si substrate 21.

Figure 12A:
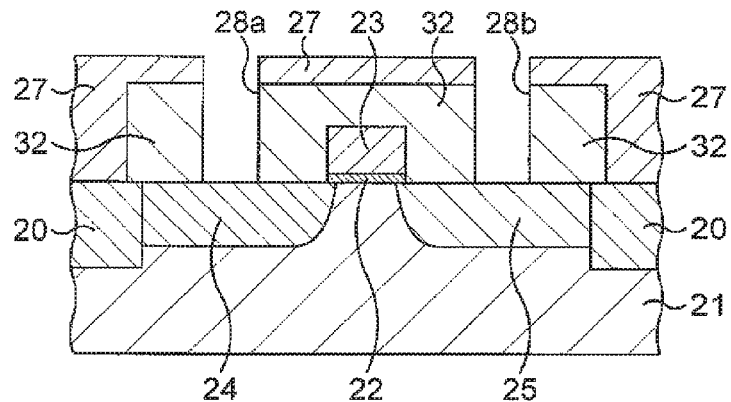
FIG. 12A to FIG. 12C are schematic sectional views illustrating main stops of the method of manufacturing the MOS transistor according to the modified example of the second embodiment in order subsequent to FIG. 11C.

Subsequently, as illustrated in FIG. 12A, contact holes 28a, 28b are formed in the organic film 32 and the interlayer insulating film 27.

In detail, the organic film 32 and the interlayer insulating film 27 are processed by the lithography and dry etching. Thus, contact holes which expose a part of the surface of the source region 24, a part of the surface of the drain region 25, and a part of the surface of the gate electrode 23 respectively are formed in the organic film 32 and the interlayer insulating film 27. In FIG. 12A, only the contact holes 28a, 28b which expose the part of the surface of the source region 24 and the part of the surface of the drain region 25 are illustrated.

Figure 12B:
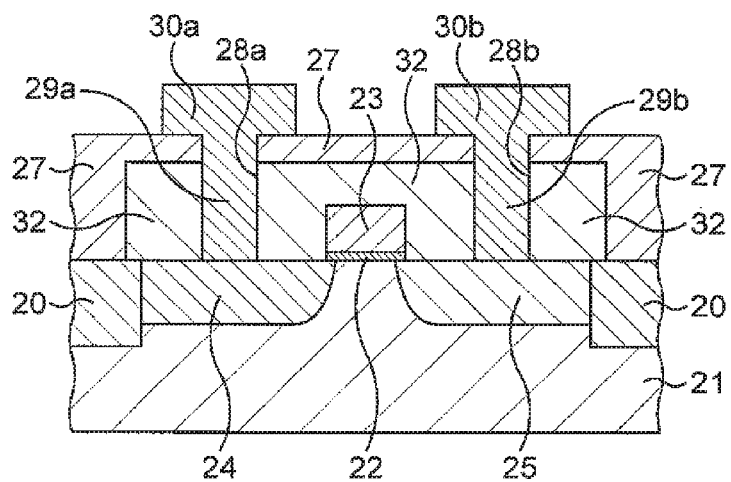

Subsequently, as illustrated in FIG. 12B, wirings 30a, 30b are formed.

In detail, for example, TiW/Au is first deposited as a conductive film, here, a two-layer metal film on the entire surface of the interlayer insulating film 27 by the sputtering method so as to fill the contact holes 28a, 28b. The metal film is formed such that TiW is formed as a lower layer on the interlayer insulating film 27 so as to cover the inner wall surfaces of the contact holes 28a, 28b and Au is formed as an upper layer on the interlayer insulating film 27 so as to fill the contact holes 28a, 28b via TiW. Note that the metal film is formed to similarly fill the contact hole which exposes the part of the surface of the gate electrode 23.

Subsequently, a resist is applied onto the metal film and processed by the lithography to form into a resist mask having openings corresponding to desired wirings on the metal film. The openings of the resist mask are filled with Au, for example, by the Au plating method, and the resist mask is removed by the ashing or wet treatment.

Then, an excessive metal film on the interlayer insulating film 27 is removed by the lithography and dry etching. The wirings 30a, 30b are thereby formed which extend on the interlayer insulating film 27 and are electrically connected to the source region 24 and the drain region 25 via connection parts 29a, 29b made by filling the contact holes 28a, 28b with TiW/Au. Note that a wiring which is electrically connected to the gate electrode 23 via a connection part made by filling the contact hole with TiW/Au is also formed similarly to the wirings 30a, 30b.

Figure 12C:
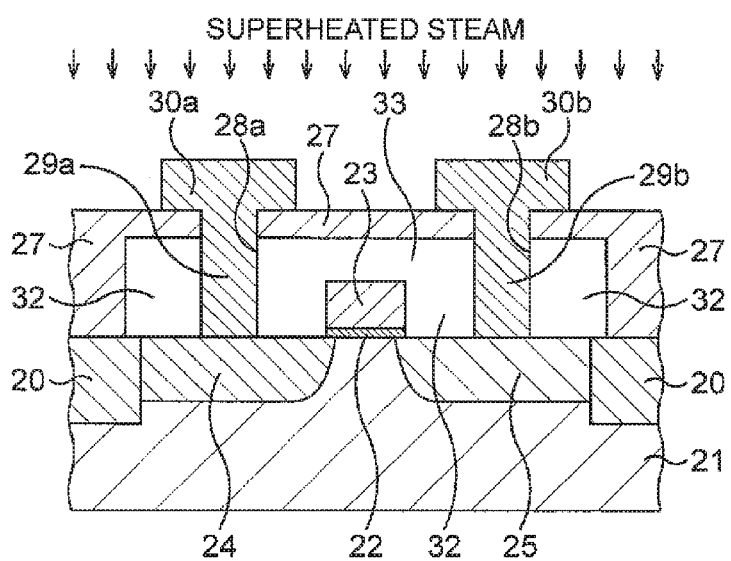

Subsequently, as illustrated in FIG. 12C, the organic film 32 is removed to form a cavity 33 in the interlayer insulating film 27.

In detail, superheated steam at about 200° C. to about 300° C., for example, about 250° C. is supplied to the interlayer insulating film 27. Since the interlayer insulating film 27 is the porous insulating material that has a property of transmitting superheated steam, the supplied superheated steam is transmitted through the interlayer insulating film 27 and reaches the organic film 32. The organic film 32 is the material that has a property of dissolving in superheated steam, and is thus dissolved by the supply of the superheated steam and is removed through pores in the interlayer insulating film 27. Thus, the organic film 32 is removed and the cavity 33 is formed between the interlayer insulating film 27 and the gate electrode 23, the source region 24 and the drain region 25.

Instead of supplying the superheated steam, supercritical water at about 200° C. to about 300° C., for example, about 250° C. may be supplied to the interlayer insulating film 27. In this case, the organic film 32 is dissolved by the supply of the supercritical water and is removed through pores in the interlayer insulating film 27. Thus, the organic film 32 is removed and the cavity 33 is formed between the interlayer insulating film 27 and the gate electrode 23, the source region 24 and the drain region 25.

The cavity 33 is formed at a portion where the interlayer insulating film 27 and the organic film 32 have existed. The organic film 32 has been formed at a portion including the gate electrode 23, the source region 24 and the drain region 25. Therefore, the cavity 33 is formed between the interlayer insulating film 27 and the surface of the gate electrode 23, the surface of the source region 24, the surface of the drain region 25, and parts of the surfaces of the connection parts 29a, 29b (and also a part of the surface of the connection part for the gate electrode 23).

Thereafter, through post-steps such as electrical connection of the wirings 30a, 30b (and also the wiring for the gate electrode 23) and so on, the MOS transistor is formed.

As described above, according to this embodiment, a highly reliable MOS transistor excellent in preventing signal propagation delay, in which the parasitic capacitance due to the interlayer insulating film around the gate electrode can be reduced as much as possible to sufficiently improve the maximum operating frequency is realized.

Third Embodiment

In this embodiment, a power supply device to which the AlGaN/GaN HEMT of the first embodiment or its modified example is applied is disclosed.

Figure 13:
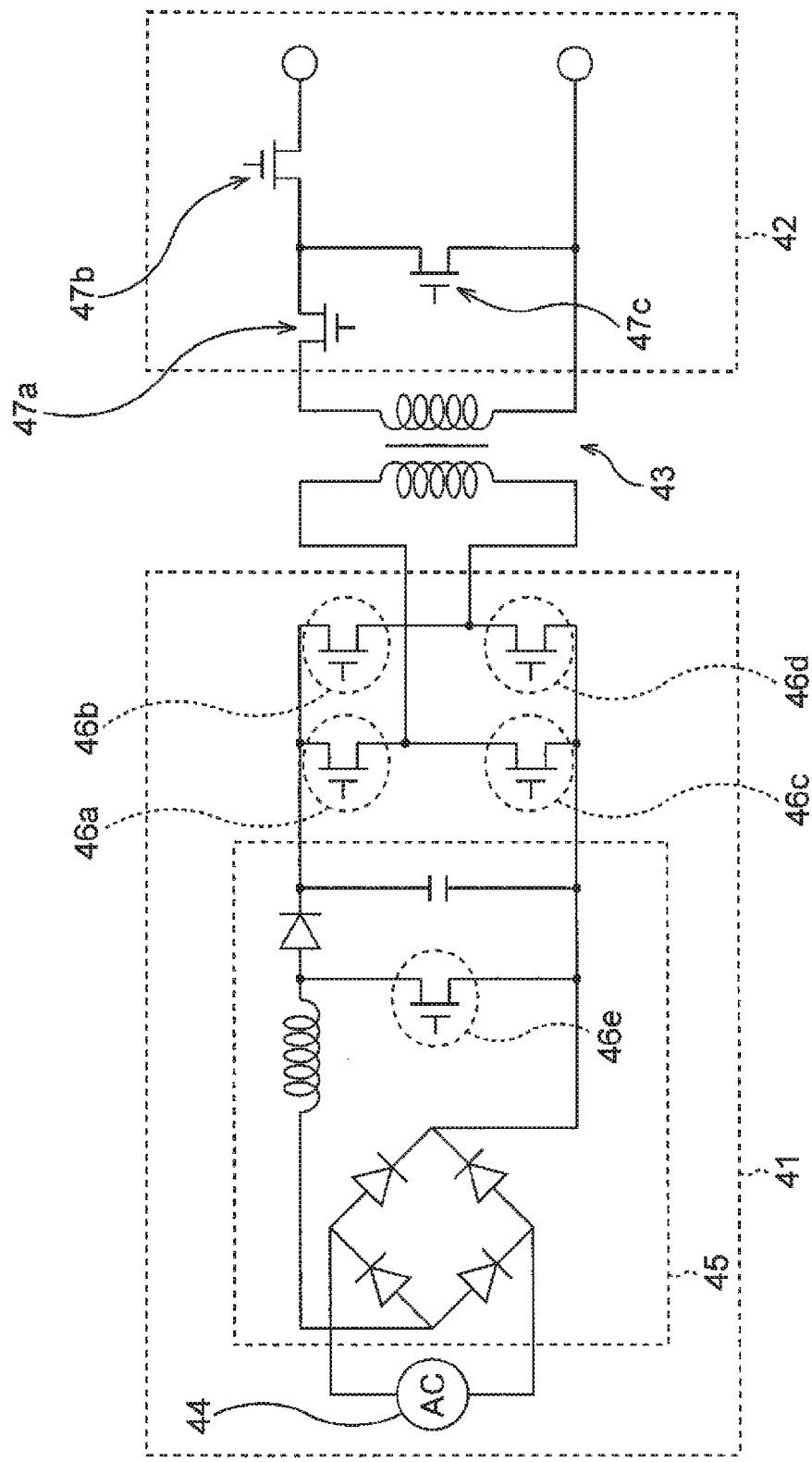
FIG. 13 is a connection diagram illustrating a schematic structure of a power supply device according to a third embodiment.

FIG. 13 is a connection diagram illustrating a schematic structure of the power supply device according to the third embodiment.

The power supply device according to this embodiment includes a high-voltage primary-side circuit 41, a low-voltage secondary-side circuit 42, and a transformer 43 disposed between the primary-side circuit 41 and the secondary-side circuit 42.

The primary-side circuit 41 includes an AC power source 44, a so-called bridge rectifying circuit 45, and a plurality of (four here) switching elements 46a, 46b, 46c, 46d. Further, the bridge rectifying circuit 45 has a switching element 46e.

The secondary-side circuit 42 includes a plurality of (three here) switching elements 47a, 47b, 47c.

In this embodiment, the switching elements 46a, 46b, 46c, 46d, 46e of the primary-side circuit 41 are each the AlGaN/GaN HEMT according to the first embodiment or its modified example. On the other hand, the switching elements 47a, 47b, 47c of the secondary-side circuit 42 are each an ordinary MIS FET using silicon.

In this embodiment, a highly reliable and high-withstand-voltage AlGaN/GaN HEMT excellent in high-frequency characteristics, in which the parasitic capacitance due to the interlayer insulating film around the gate electrode can be reduced as much as possible to sufficiently improve the maximum operating frequency is applied to a high-voltage circuit. Consequently, a highly reliable and large-power supply circuit is realized.

Fourth Embodiment

In this embodiment, a high-frequency amplifier to which the AlGaN/GaN HEMT according to the first embodiment or its modified example is applied is disclosed.

Figure 14:
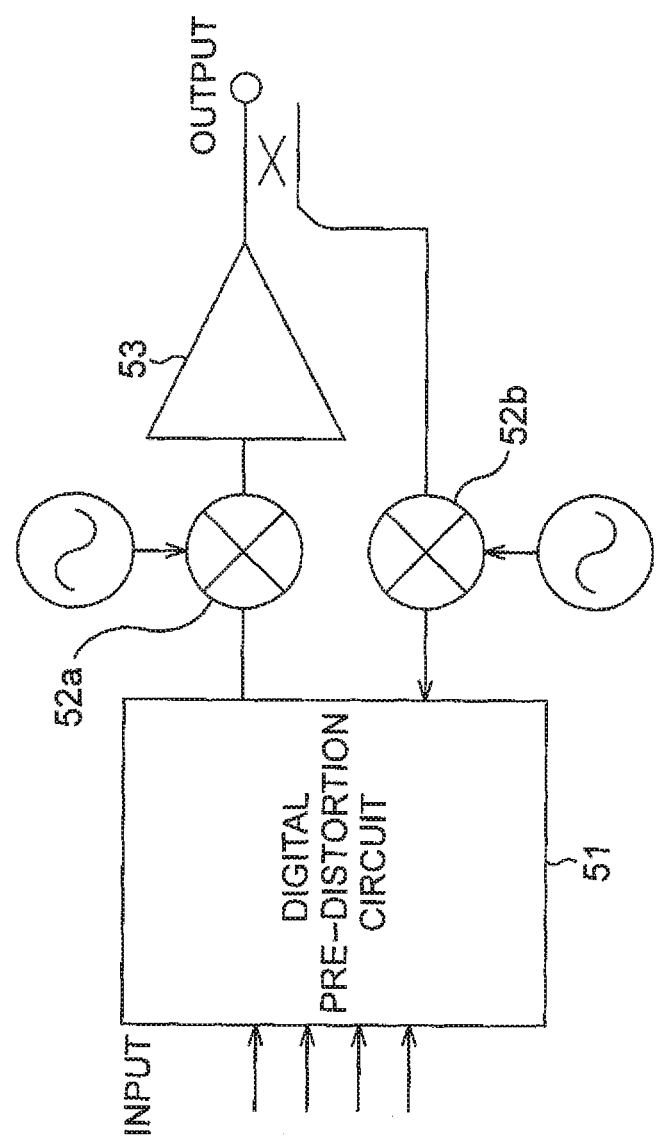
FIG. 14 is a connection diagram illustrating a schematic structure of a high-frequency amplifier according to a fourth embodiment.

FIG. 14 is a connection diagram illustrating a schematic structure of the high-frequency amplifier according to the fourth embodiment.

The high-frequency amplifier according to this embodiment includes a digital pre-distortion circuit 51, mixers 52a, 52b, and a power amplifier 53.

The digital pre-distortion circuit 51 compensates nonlinear distortion of an input signal. The mixer 52a mixes the input signal whose nonlinear distortion is compensated and an AC signal. The power amplifier 53 amplifies the input signal mixed with the AC signal, and has the AlGaN/GaN HEMT according to the first embodiment or its modified example. In FIG. 14, by, for example, changing of the switches, an output-side signal can be mixed with the AC signal by the mixer 52b, and the resultant can be sent out to the digital pre-distortion circuit 51.

In this embodiment, a highly reliable and high-withstand-voltage AlGaN/GaN HEMT excellent in high-frequency characteristics, in which the parasitic capacitance due to the interlayer insulating film around the gate electrode can be reduced as much as possible to sufficiently improve the maximum operating frequency is applied to a high-frequency amplifier. Consequently, a highly reliable and high-withstand-voltage high-frequency amplifier is realized.

According to the above embodiments, a highly reliable semiconductor device in which the parasitic capacitance due to an interlayer insulating film around an electrode can be reduced as much as possible to sufficiently improve the maximum operating frequency is realized.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A method of manufacturing a semiconductor device comprising:
   forming a first electrode;
   forming a second electrode;
   covering the first electrode and the second electrode with a filled material;
   forming an interlayer insulating film covering the filled material;
   forming connection parts which penetrate the filled material and the interlayer insulating film and are electrically connected to the first electrode and the second electrode;
   forming a protective film covering upper and side surfaces of the first electrode and the second electrode; and
   removing the filled material to form a cavity between the interlayer insulating film, a surface of the protective film, between the side surfaces of the first and second electrode and the interlayer insulating film with the protection film interposed therebetween and parts of surfaces of the connection parts;
   wherein the filled material is removed through pores in the interlayer insulating film to form the cavity.

2. The method of manufacturing a semiconductor device according to claim 1,
   wherein the interlayer insulating film is made of a porous insulating material.

3. The method of manufacturing a semiconductor device according to claim 2,
   wherein the filled material is a photolytic material, and
   wherein the filled material is removed by photolysis.

4. The method of manufacturing a semiconductor device according to claim 3,
   wherein the interlayer insulating film is made of a material having a property of transmitting ultraviolet rays, and
   wherein ultraviolet rays are applied to the interlayer insulating film to photolyze the filled material.

5. The method of manufacturing a semiconductor device according to claim 4,
   wherein ultraviolet rays with a wavelength of 250 nm or more and 400 nm or less are applied to the interlayer insulating film.

6. The method of manufacturing a semiconductor device according to claim 2,
   wherein the filled material is a material dissolving in superheated steam or supercritical water, and
   wherein the filled material is dissolved and removed by superheated steam or supercritical water.

7. The method of manufacturing a semiconductor device according to claim 1,
   wherein the first electrode and the second electrode are formed above a compound semiconductor layer.

* * * * *